US009231576B1

(12) United States Patent
Li et al.

(10) Patent No.: US 9,231,576 B1
(45) Date of Patent: Jan. 5, 2016

(54) DEVICE AND METHOD FOR CLOCK SIGNAL LOSS DETECTION

(71) Applicant: Montage Technology (Shanghai) Co., Ltd., Shanghai (CN)

(72) Inventors: Yi Li, Shanghai (CN); Yong Wang, Shanghai (CN)

(73) Assignee: MONTAGE TECHNOLOGY (SHANGHAI) CO., LTD., Shanghai (CN)

( * ) Notice: Subject to any disclaimer, the term of this patent is extended or adjusted under 35 U.S.C. 154(b) by 62 days.

(21) Appl. No.: 14/337,839

(22) Filed: Jul. 22, 2014

(30) Foreign Application Priority Data

Jun. 30, 2014 (CN) .......................... 2014 1 0307669

(51) Int. Cl.
*H03K 5/19* (2006.01)

(52) U.S. Cl.
CPC ....................................... *H03K 5/19* (2013.01)

(58) Field of Classification Search
CPC ........................................................ H03K 5/19
USPC ...................................................... 327/18, 20
See application file for complete search history.

(56) References Cited

U.S. PATENT DOCUMENTS 4,633,097 A 12/1986 Dewitt
5,619,643 A 4/1997 Moroni et al.
6,314,150 B1 * 11/2001 Vowe ...................... H03L 7/095 327/150
7,065,169 B2 * 6/2006 Hartwell ................ G06F 13/24 327/151
8,212,601 B2 7/2012 Davis
8,248,169 B2 8/2012 Honda

* cited by examiner

*Primary Examiner* — William Hernandez
(74) *Attorney, Agent, or Firm* — Perkins Coie LLP

(57) ABSTRACT

A device, comprises a first counter and a second counter, a control unit and a comparing unit. The first counter and the second counter are configured to alternately count a cycle number of a monitoring clock signal. The control unit is configured to generate, based on an input clock, both a first counter enable signal and a second counter enable signal that enable or disable the first and the second counters respective, and the first counter enable signal and the second counter enable signal are inverted. The comparing unit is coupled to both the first counter and the second counter and configured to detect a loss fault of the input clock if the cycle number of the monitoring signal counted by one of the first and the second counters exceed a predetermined threshold.

24 Claims, 12 Drawing Sheets

10
monitoring clock signal mck
CNT1
input clock in_ck
CTRL
CMP
CNT2

DEVICE AND METHOD FOR CLOCK SIGNAL LOSS DETECTION

CROSS REFERENCE TO RELATED APPLICATION

This application claims priority to Chinese application No. 201410307669.5 entitled "device and method for clock signal loss detection," filed on Jun. 30, 2014 by Montage Technology (Shanghai) Co., Ltd., which is incorporated herein by reference.

TECHNICAL FIELD

The present invention relates to clock signal loss detection, and more particularly, but not limited to a device and method for clock signal loss detection.

BACKGROUND

The conventional method of clock loss detection tests average frequency during a predetermined period, therefore it may not promptly detect input clock loss fault. Further, there may be one cycle sampling error in start and stop point. Further, in order for the method to work, input clock duty cycle should meet Nyquist sampling theory to find an edge transition. Due to the above disadvantage of existing clock loss detection method, it is desirable to have a new device and method of detecting input clock loss.

SUMMARY

According to an embodiment of the present invention, a device comprises a first counter and a second counter, wherein the first counter and the second counter are configured to alternately count a cycle number of a monitoring clock signal; a control unit configured to generate, based on an input clock, both a first counter enable signal and a second counter enable signal that enable or disable the first and the second counters respectively, wherein the first counter enable signal and the second counter enable signal are inverted; and a comparing unit coupled to both the first counter and the second counter and configured to detect a loss fault of the input clock if the cycle number of the monitoring clock signal counted by one of the first and the second counters exceed a predetermined threshold.

According to another embodiment of the invention, a method in a device comprises alternately counting a cycle number of a monitoring clock signal respectively by a first counter and a second counter; generating, by a control unit based on an input clock, both a first counter enable signal and a second counter enable signal that enable or disable the first and the second counters respectively, wherein the first counter enable signal and the second counter enable signal are inverted; and detecting, by a comparing unit, a loss fault of the input clock, if the cycle number of the monitoring clock signal counted by one of the first and the second counters exceed a predetermined threshold.

DESCRIPTION OF THE DRAWINGS

The present invention is illustrated in an exemplary manner by the accompanying drawings. The drawings should be understood as exemplary rather than limiting, as the scope of the invention is defined by the claims. In the drawings, the identical reference signs represent the same elements.

DETAILED DESCRIPTION

Various aspects and examples of the invention will now be described. The following description provides specific details for a thorough understanding and enabling description of these examples. Those skilled in the art will understand, however, that the invention may be practiced without many of these details. Additionally, some well-known structures or functions may not be shown or described in detail, so as to avoid unnecessarily obscuring the relevant description.

Figure 1:
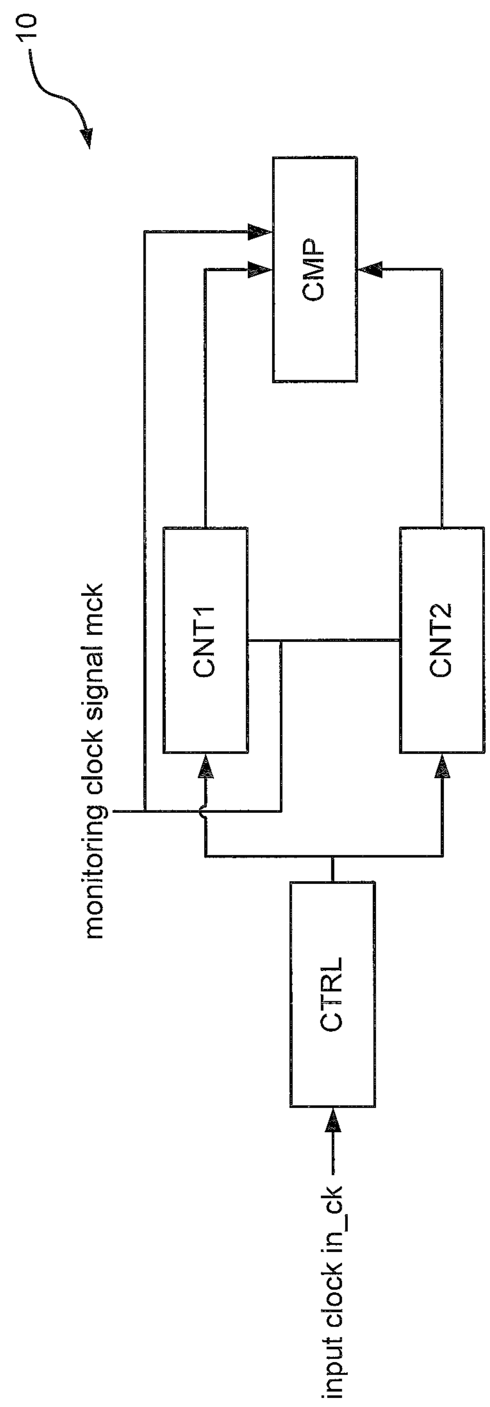
FIG. 1 is a block diagram illustrating an embodiment of a device for clock signal loss detection.

FIG. 1 is a block diagram illustrating an embodiment of a device for clock signal loss detection. The device 10 comprises a control unit CTRL, a first counter CNT1, a second counter CNT2, a comparing unit CMP. The first counter CNT1 and the second counter CNT2 are configured to alternately count a cycle number of a monitoring clock signal mck. The control unit CTRL is configured to generate, based on an input clock in_ck, both a first counter enable signal cnt1_en and a second counter enable signal cnt2_en that enable or disable the first and the second counters CNT1 and CNT2 respectively. The first counter enable signal cnt1_en and the second counter enable signal cnt2_en are inverted. That is, when the first counter enable signal cnt1_en is logic high, the second counter enable signal cnt2_en is logic low. The first counter enable signal cnt1_en enables the first counter CNT1 so that the first counter CNT1 counts, meanwhile the second counter enable signal cnt2_en disables the second counter CNT2 so that the second counter CNT2 does not count.

The comparing unit CMP is coupled to both the first counter CNT1 and the second counter CNT2 and the comparing unit CMP is configured to detect a loss fault of the input clock if the cycle number of the monitoring clock signal mck counted by one of the first and the second counters CNT1, CNT2 exceed a predetermined threshold. For example, an input clock loss threshold can be quantized by the monitoring clock signal mck's period, and the result is set as the first and second counters CNT1 and CNT2's predetermined threshold. Assume the loss threshold is 1000 ns, and the monitoring clock signal mck's period is 100 ns, then counter predetermined threshold is 10. 10 is obtained from the loss threshold value 1000 ns divided by mck's period 100 ns. It means during 10 mck period, the in_ck must toggle at least one time. That is, if the comparing unit CMP detects any one of counters CNT1 or CNT2 counts more than 10, the compare unit CMP detects the input clock is lost. In another embodiment, if the loss threshold remains 1000 ns, and the monitoring clock signal mck's period is 65 ns, the predetermined threshold can be 15 or 16. Note the predetermined threshold can be different based on the cycle number of loss threshold.

Figure 2:
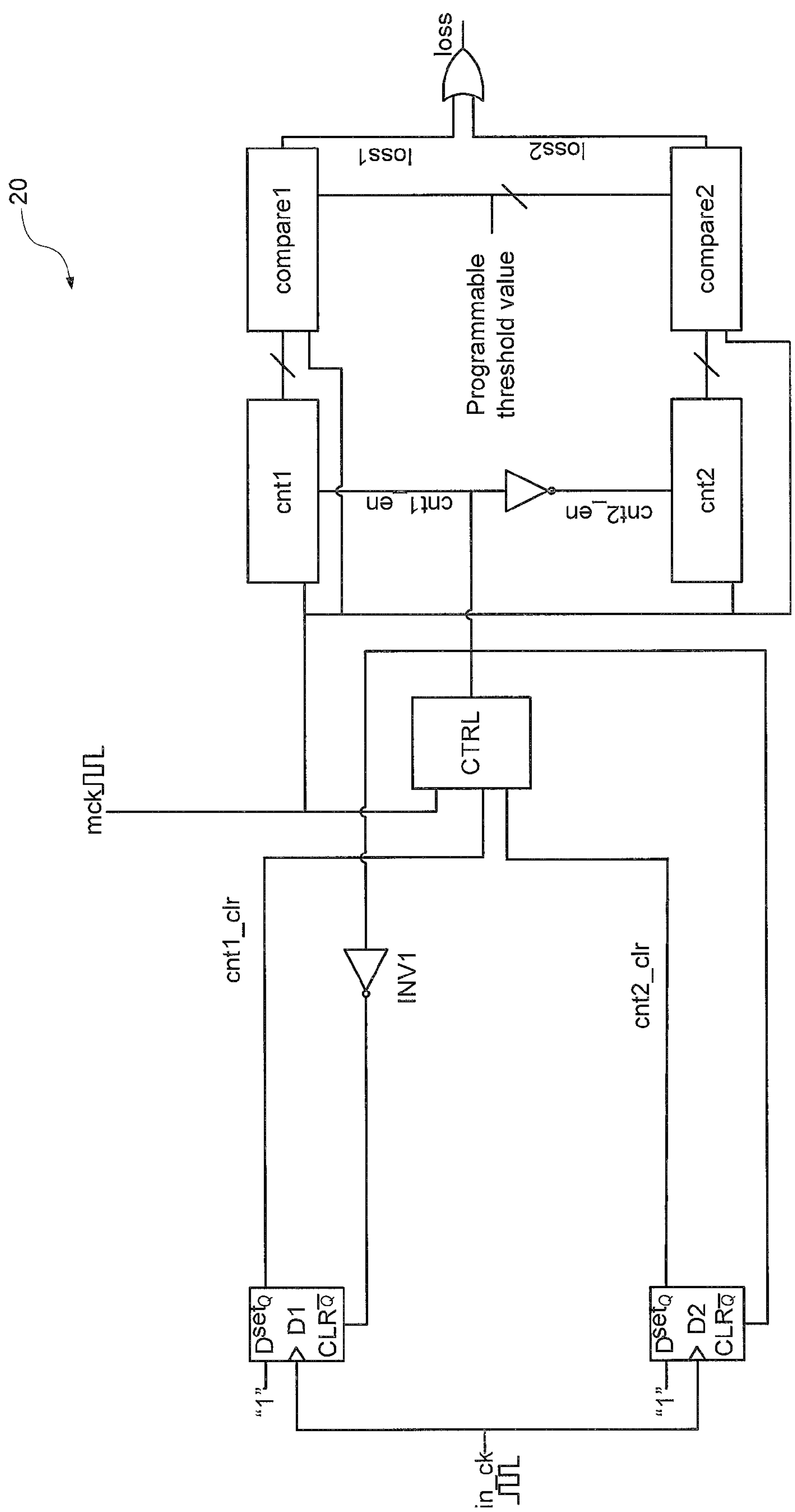
FIG. 2 is a circuit diagram illustrating an implementation of the device shown in FIG. 1.

FIG. 2 is a circuit diagram illustrating an implementation 20 of the device 10 shown in FIG. 1. The device 20 further comprises a first D-type flip flop D1, and a second D-type flip flop D2. Both clock ports (which are each shown as a small triangle on the left side of the D-type flip flop) of the first D-type flip flop D1 and the second D-type flip flop D2 are configured to receive the input clock in_ck. The output port of the control unit CTRL is connected to a clear port CLR of the second D-type flip flop D2. The output port of the control unit CTRL is further connected to a clear port CLR of the first D-type flip flop D1 through a first inverter INV1.

The compare unit CMP in FIG. 1 can be implemented by a first comparator COMPARE1 and a second comparator COMPARE2 in FIG. 2. The first comparator COMPARE1 is configured to generate a first loss signal loss1, and the second comparator COMPARE2 is configured to generate a second loss signal loss2. The details of first comparator COMPARE1 and the second comparator COMPARE2 will be described with the following FIG. 3.

Figure 3:
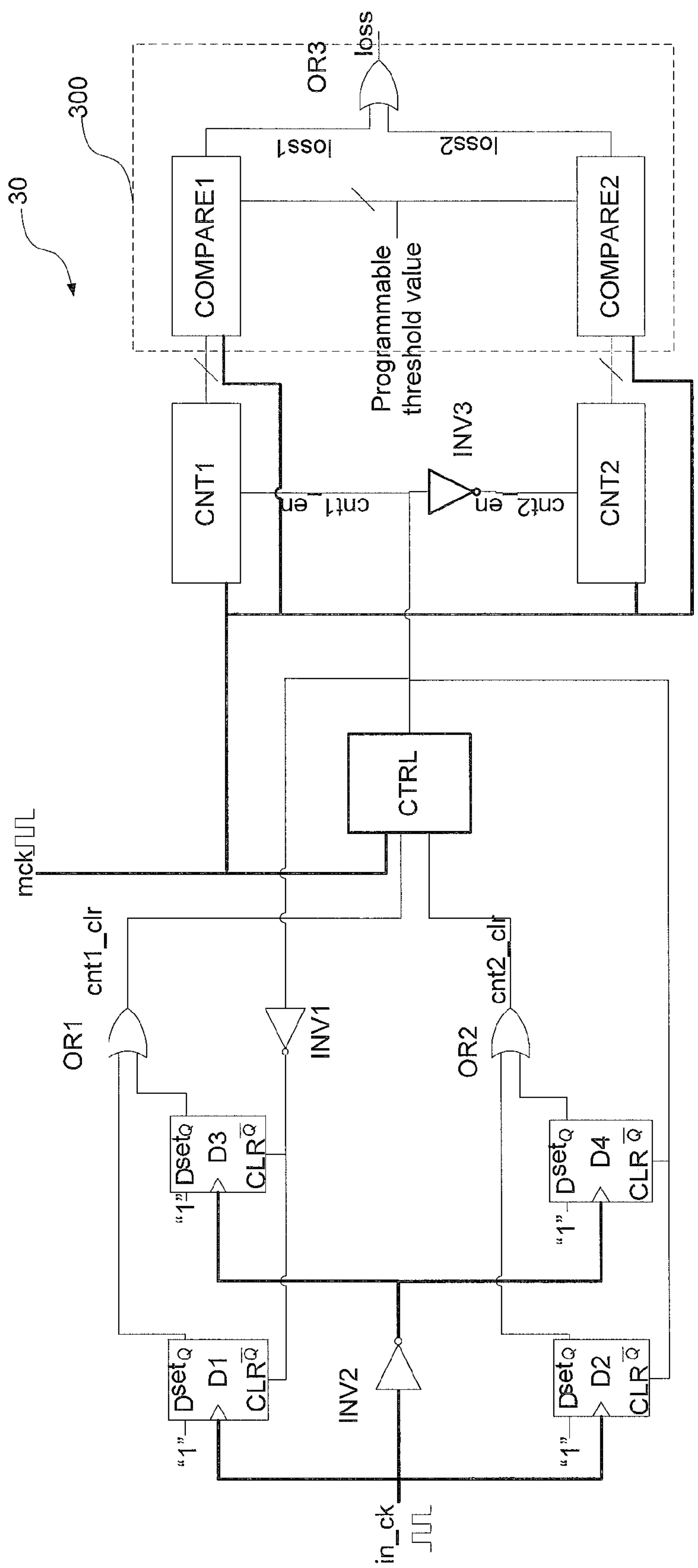
FIG. 3 is a circuit diagram illustrating another implementation of the device shown in FIG. 1.

FIG. 3 is a circuit diagram illustrating another implementation 30 of the device shown in FIG. 1. The device 30 shown in FIG. 3 comprises a first D-type flip flop D1, a second D-type flip flop D2. The device 30 further comprises a third D-type flip flop D3 and a fourth D-type flip flop D4, a first OR gate OR1, a second OR gate OR2, a second inverter INV2. As the first and second D-type flip flops D1 and D2 are similar to that of FIG. 2, details are omitted for elements already described with respect to FIG. 2.

Both Q ports of the first D-type flip flop D1 and the third D-type flip flop D3 are connected to input ports of the first OR gate OR1. An output port of the first OR gate OR1 is connected to the control unit CTRL. Both Q ports of the second D-type flip flop D2 and the fourth D-type flip flop D4 are connected to input ports of the second OR gate OR2. An output port of the second OR gate OR2 is connected to the control unit CTRL.

Both clock ports of the third D-type flip flop D3 and the fourth D-type flip flop D4 are configured to receive an inversion of the input clock in_ck. As shown in FIG. 3, both clock ports of the third D-type flip flop D3 and the fourth D-type flip flop D4 are connected to an output of the second inverter INV2, and an input of the second inverter INV2 is configured to receive the input clock in_ck. The output port of the control unit CTRL is connected to a clear port (CLR) of the fourth D-type flip flop D4, and the output port of the control unit CTRL is further connected to a clear port (CLR) of the third D-type flip flop D3 via the first inverter INV1; wherein all D ports of the first D-type flip-flop D1, second D-type flip-flop D2, third D-type flip-flop D3 and fourth D-type flip-flops D4 are connected to a logic high "1".

The comparing unit 300 comprises a first comparator COMPARE1, a second comparator COMPARE2 and a third OR gate OR3. The first comparator COMPARE1 is connected to the first counter CNT1 and an output port (which outputs signal loss1) of the first comparator COMPARE1 is connected to a first input port of the third OR gate OR3. The first comparator COMPARE1 is also configured to receive the monitoring clock signal mck and compare the cycle number counted by the first counter CNT1 with the cycle number of mck. The second comparator COMPARE2 is connected to the second counter CNT2. An output port (which outputs signal loss2) of the second comparator COMPARE2 is connected to a second input port of the third OR gate OR3. The second comparator COMPARE2 is also configured to receive the monitoring clock signal mck and compare the cycle number counted by the second counter CNT2 with the cycle number of mck. The output of the third OR gate OR3 is configured to indicate the loss fault of the input clock in_ck if the cycle number of the monitoring clock signal mck counted by one of the first and the second counters CNT1 and CNT2 exceed a predetermined threshold.

The device 30 further comprises a third inverter INV3. The control unit CTRL is configured to output the first counter enable signal cnt1_en. The control unit CTRL is also configured to output the second counter enable signal cnt2_en through a third inverter INV3. With the third inverter INV3, the unexpected data relationship (always inverted) between the first counter enable signal cnt1_en and the second counter enable signal cnt2_en that caused by metastability can be reduced or avoided.

Two pairs of D-flip-flop (the pair of D-type flip flops D1&D3, the pair of D-type flip flops D2&D4) generate 'cnt1_clr' and 'cnt2_clr' respectively and each pair only works with its corresponding counter. One of the D-flip-flops in a pair is triggered by the rising edge of 'in_ck', and the other in the pair is triggered by the falling edge of 'in_ck'. Taken the pair comprising D1 and D3 as an example, the first D-type flip flop D1 is triggered by a rising edge of the input clock in_ck, and the second D-type flip flop D2 is triggered by a falling edge of the input clock in_ck. The D port (also called as data-in port) of each of the four D-flip-flops is connected to constant high. With two D-type flip flops in a pair, even if the counter set up time and counter hold time do not meet with each other, which will cause for example the first D-type flip flop to fail to detect a rising edge of the input clock in_ck, the third D-type flip flop can then detect a falling edge of the input clock, so as to guarantee an accurate count cycle number of counters.

Referring back to FIG. 2, if the device 20 can tolerate one sample error, then the third D-type flip flop D3 and the fourth D-type flip flop D4 can be omitted. In other words, the device 20 only detects rising edge of the input clock in_ck by the first or second D-type flip flop D1 or D2.

Figure 4:
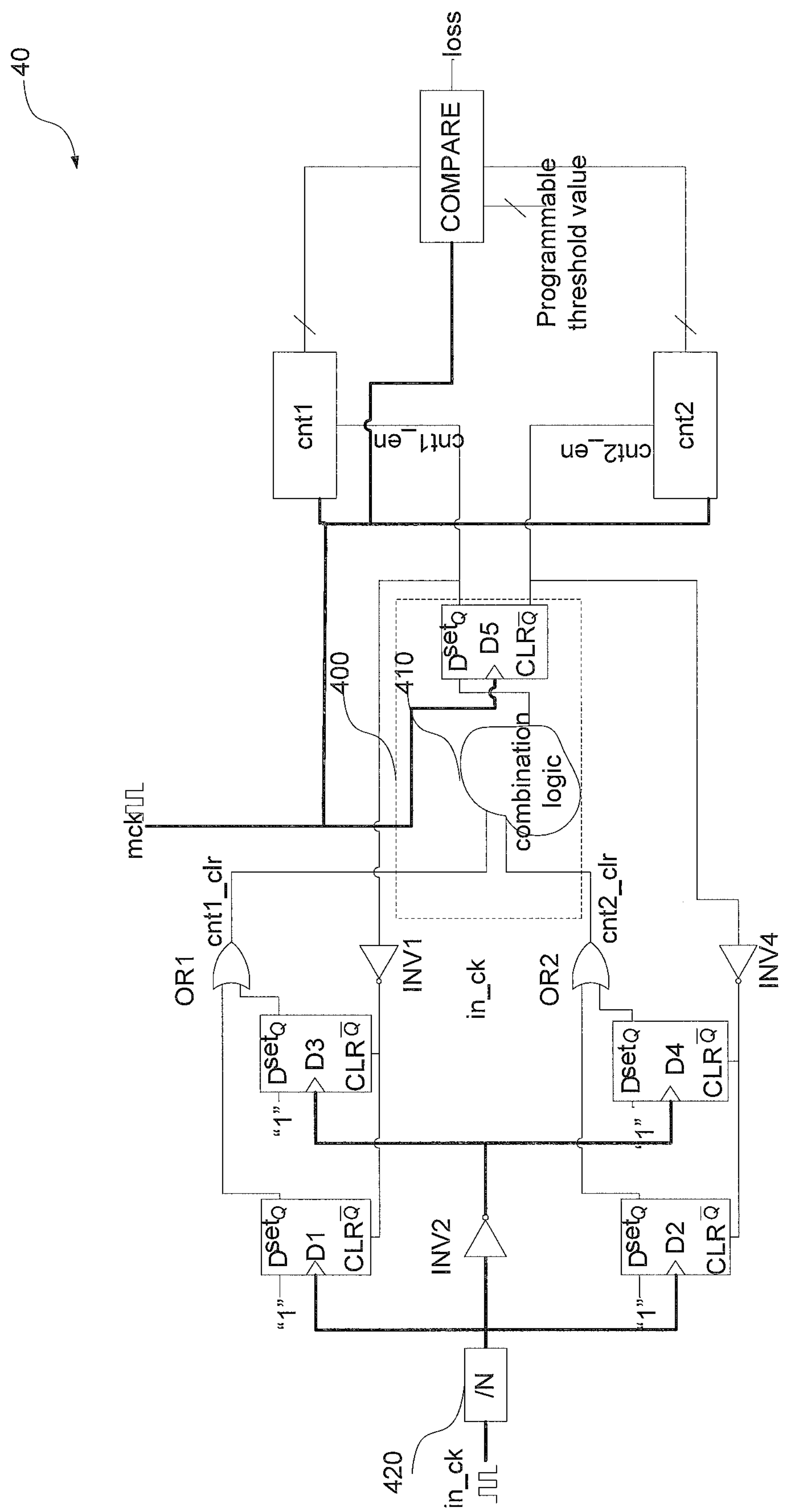
FIG. 4 is a circuit diagram illustrating another implementation of the device shown in FIG. 1.

FIG. 4 is a circuit diagram illustrating another implementation 40 of the device 10 shown in FIG. 1. As the first D-type flip flop D1, the second D-type flip flop D2, the third D-type flip flop D3, the fourth D-type flip flop D4, the first inverter INV1, the second inverter INV2, the first OR gate OR1, and the second OR gate OR2 are similar to that of FIG. 3, details are omitted for elements already described with respect to FIG. 3.

As shown in FIG. 4, the control unit 400 comprises a combination logic 410 and a fifth D-type flip flop D5. A first and a second port of the combination logic 410 are respectively connected to both an output of the first OR gate OR1 and an output of the second OR gate OR2. The combination logic 410 is configured to output, to the fifth D gate D5, a different value for detecting a high of the output of the first OR gate OR1 or the second OR gate OR2 respectively. For example, if High of the first OR gate OR1 is detected, then the combination logic 410 outputs 1, if High of the second OR gate OR2 is detected, then the combination logic 410 outputs 0. A Q port of the fifth D-type flip flop D5 is configured to output the first counter enable signal crd_en, and the NOT Q port of the fifth D-type flip flop D5 is configured to output the second counter enable signal cnt2_en. The Q port of the fifth D-type flip flop D5 is connected to the clear ports of both the first D-type flip flop D1 and the third D-type flip flop D3 via the first inverter INV1. The not Q port of the fifth D-type flip flop D5 is connected to the clear ports of both the second D-type flip flop D2 and the fourth D-type flip flop D4 via the fourth inverter INV4. Note different from FIG. 3 in which the clear port CLR of all of the D-type flip flop D1, D2, D3 and D4 are connected to a same output port of the control unit CTRL, in FIG. 4, the clear port of the pair of D-type flip flops D1 and D3 receive Q port output of the fifth D-type flip flop D5, while clear port of the pair of D-type flip flops D2 and D4 receive NOT Q port output of the fifth D-type flip flop D5. Note the CLR port of D1 to D4 can be SET/RESET/SETB/RESTB port, and inverters may need to be inserted or removed accordingly. The function of the CLR port is to allow the D-type flip flops (DFFs) to be back to their initial value. For example, if CLR ports of D1 to D4 are all CLRB (or RESETB), which means the logic low on the port will set the Q port to 0, then inverters INV1 and INV4 can be omitted.

The device 40 further comprises a frequency divider 420. The frequency divider 420 is configured to divide the input clock in_ck by N before the input clock in_ck is input to the control unit 400.

The compare unit COMPARE is an implementation of the compare unit CMP shown in FIG. 1. As the first counter CNT1 and the second counter CNT2 works alternately, one COMPARE unit is sufficient to detect whether the cycle number counted by one of the counters exceed the threshold value, and generates a loss signal to indicate loss of input clock in_ck.

Figure 5:
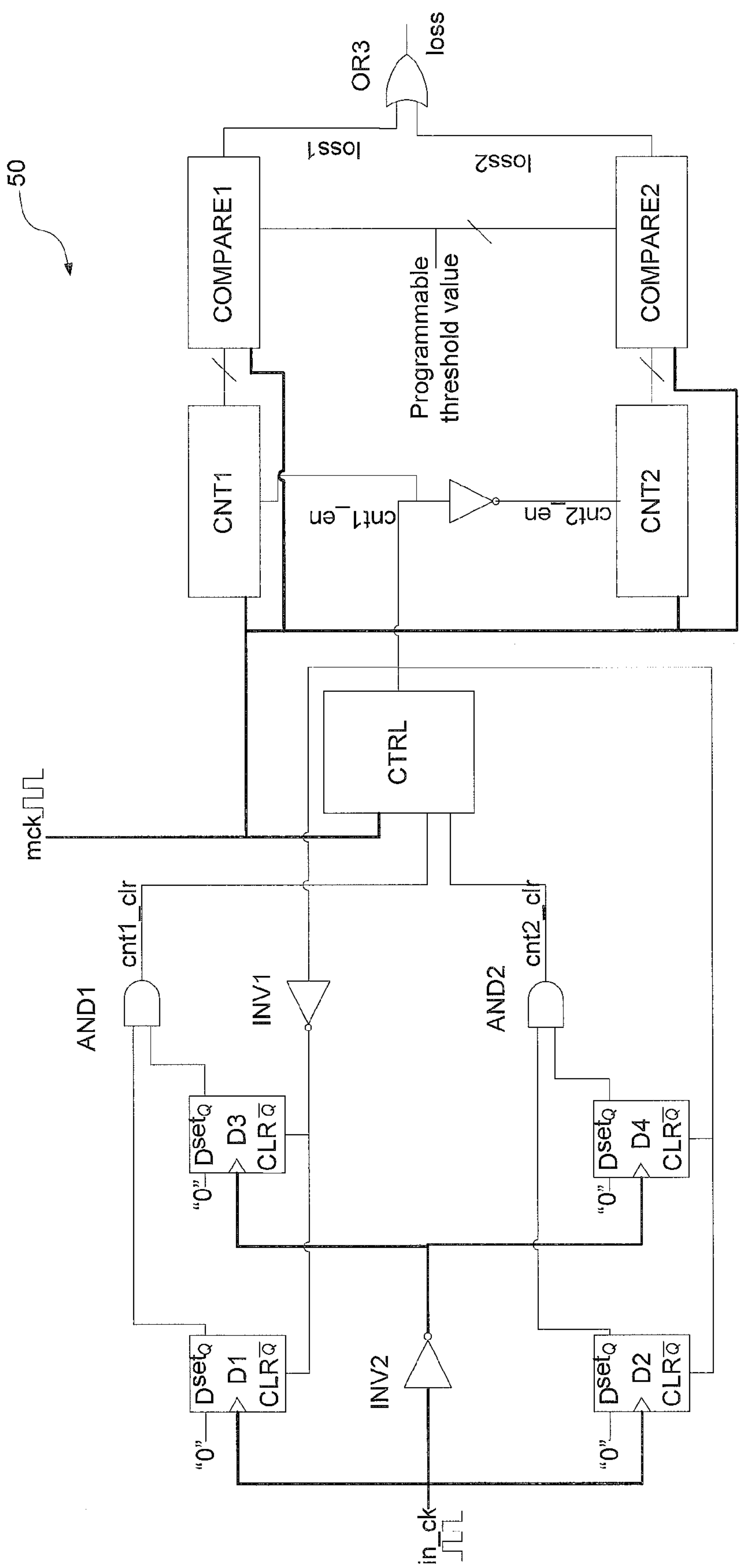
FIG. 5 is a circuit diagram illustrating another implementation of the device shown in FIG. 1.

FIG. 5 is a circuit diagram illustrating another implementation 50 of the device 10 shown in FIG. 1. The device 50 shown in FIG. 5 comprises a first D-type flip flop D1, a second D-type flip flop D2. The device 50 further comprises a third D-type flip flop D3 and a fourth D-type flip flop D4, a first AND gate AND1, a second AND gate AND2, and two comparators COMPARE1 and COMPARE2.

Both Q ports of the first D-type flip flop D1 and the third D-type flip flop D3 are connected to input ports of the first AND gate AND1. An output port of the first AND gate AND1 is connected to the control unit CTRL. Both Q ports of the second D-type flip flop D2 and the fourth D-type flip flop D4 are connected to input ports of the second AND gate AND2. An output port of the second AND gate AND2 is connected to the control unit CTRL. The output port of the control unit CTRL is connected to a clear port CLR of the second D-type flip flop D2, and the output port of the control unit CTRL is further connected to a clear port CLR of the first D-type flip flop D1 through a first inverter INV1.

Both clock ports of the third D-type flip flop D3 and the fourth D-type flip flop D4 are configured to receive an inversion of the input clock in_ck through a second inverter INV2. The output port of the control unit CTRL is connected to a clear port CLR of the fourth D-type flip flop D4, and the output port of the control unit CTRL is further connected to a clear port CLR of the third D-type flip flop through the first inverter INV1; wherein all D ports of the first, second, third and fourth D-type flip-flops D1, D2, D3 and D4 are connected to a logic low "0". Also taking the device 30 shown in FIG. 3 into consideration, the D ports of each of D-type flip flops D1, D2, D3 and D4 can be configured to receive either 0 or 1. If each of the D ports are configured to receive 0 instead of 1, then the OR gates OR1, OR2 in FIG. 3 should be changed to AND gates AND1 and AND2 shown in FIG. 5.

As the first and second comparators COMPARE1 and COMPARE2 in FIG. 5 are similar to that shown in FIG. 3, details are omitted for elements already described with respect to FIG. 3.

Figure 6:
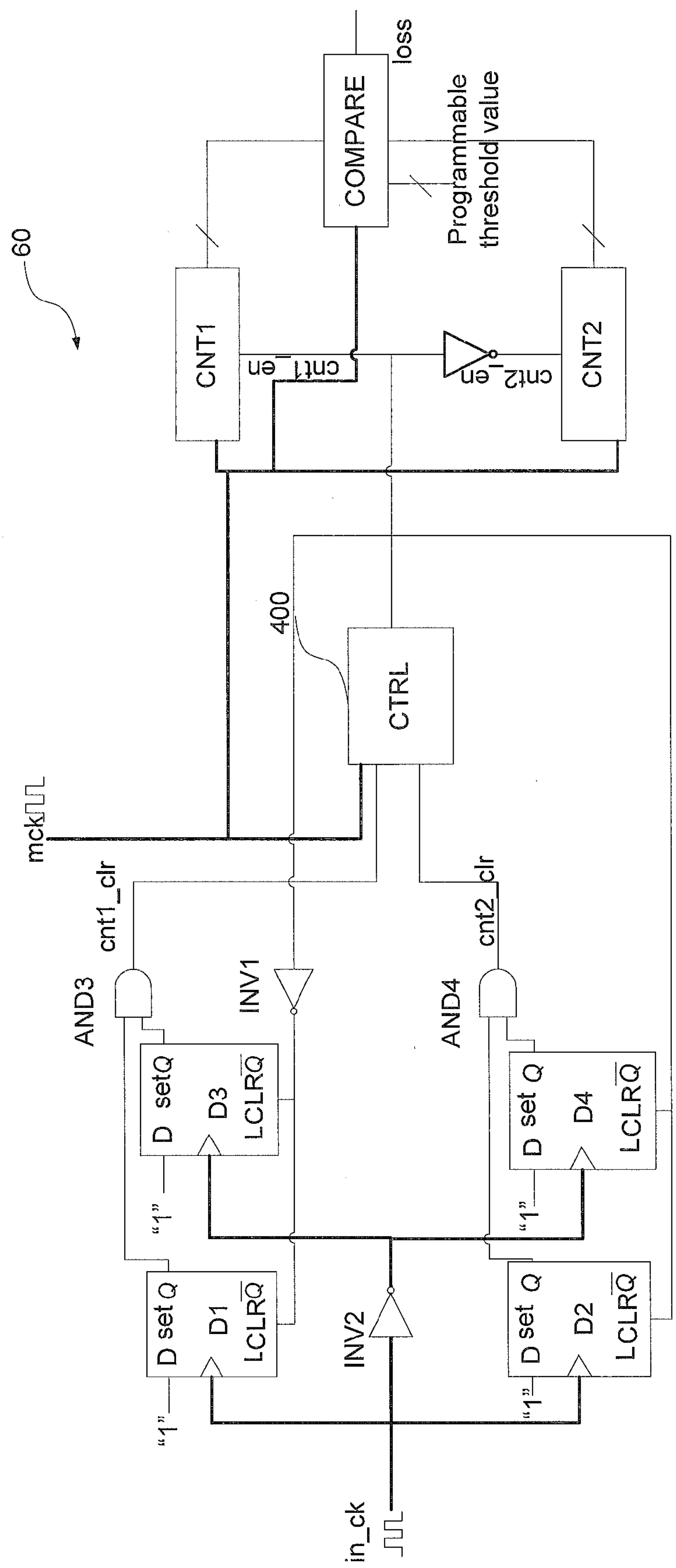
FIG. 6 is a circuit diagram illustrating another implementation of the device shown in FIG. 1.

FIG. 6 is a circuit diagram illustrating another implementation of the device shown in FIG. 1. In FIG. 6, the device 60 includes latches. As shown in FIG. 6, the device 60 comprises a first latch D1, a second latch D2, a third latch D3, a fourth latch D4, a third AND gate AND3 and a fourth AND gate AND4, a control unit CTRL and a comparator COMPARE.

Both clock ports of the first latch D1 and the second latch D2 are configured to receive the input clock in_ck. The output port of the control unit CTRL is connected to a clear port CLR of the second latch D2, and the output port of the control unit CTRL is further connected to a clear port CLR of the first latch D1 through a first inverter INV1.

Both Q ports of the first latch D1 and the third latch D3 are connected to input ports of the third AND gate AND3. An output port of the third AND gate AND3 is connected to the control unit CTRL.

Both Q ports of the second D-type flip flop D2 and the fourth D-type flip flop D4 are connected to input ports of the fourth AND gate AND4. An output port of the fourth AND gate AND4 is connected to the control unit CTRL.

Both clock ports of the third D-type flip flop D3 and the fourth D-type flip flop D4 are configured to receive an inversion of the input clock in_ck via the second inverter INV2. The output port of the control unit CTRL is connected to a clear port of the fourth D-type flip flop D4, and the output port of the control unit CTRL is further connected to a clear port of the third D-type flip flop D3 through the first inverter INV1.

As the comparator COMPARE in FIG. 6 is similar to that shown in FIG. 4, details are omitted for elements already described with respect to FIG. 4.

In an embodiment, the predetermined threshold is programmable. For example, the predetermined threshold may be adjusted based on the ratio of frequency of input clock in_ck and the frequency of monitoring clock signal mck.

Figure 7:
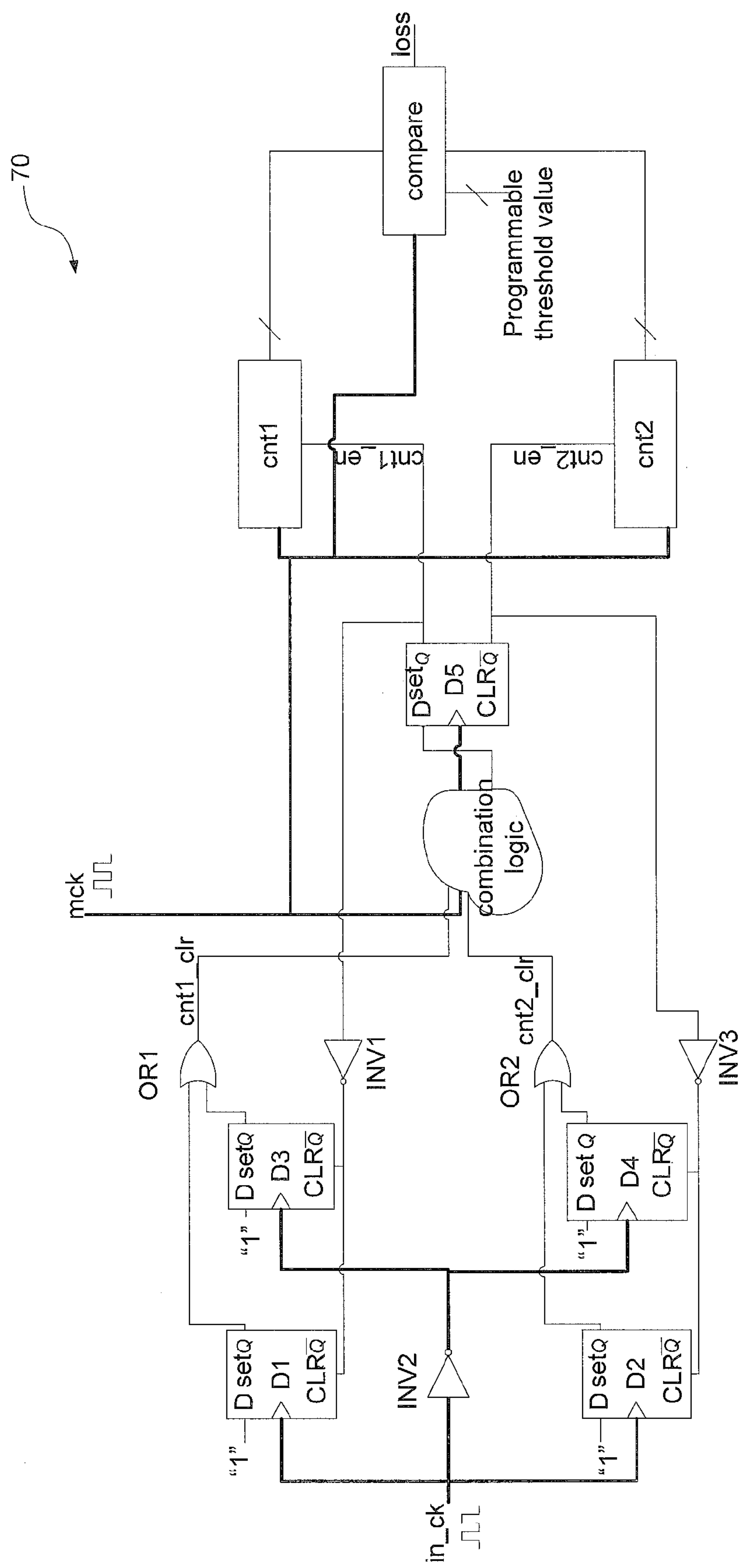
FIG. 7 is a circuit diagram illustrating another implementation of the device shown in FIG. 1.

FIG. 7 is a circuit diagram illustrating another implementation of the device shown in FIG. 1. The device 70 shown in FIG. 7 is similar to the device 40 shown in FIG. 4, the difference between FIG. 4 and FIG. 7 lies in that FIG. 4 further comprises a frequency divider 420.

Figure 8:
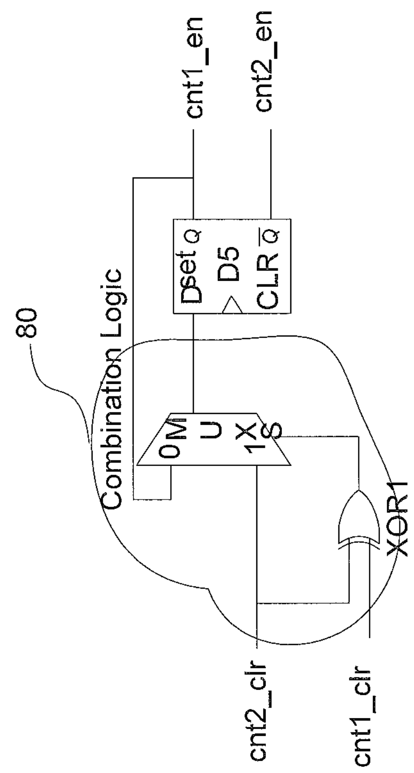
FIG. 8 is a circuit diagram illustrating an embodiment of the combination logic shown in FIG. 4 or 7.

FIG. 8 is a circuit diagram illustrating an embodiment of the combination logic shown in FIG. 4 or 7. The combination logic 80 further comprises a multiplexer MUX and a first XOR gate XOR1. The second port (which is configured to receive signal cnt2_clr) of the combination logic 80 comprises a second port of the multiplexer MUX (represented as 1 on MUX), and the second port of the multiplexer MUX is also connected to a first input port of the first XOR gate. The first port (which is configured to receive signal cnt1_clr) of the combination logic 80 comprises a second input port of the first XOR gate XOR1. A select port (represented as S on MUX) of the multiplexer is connected to an output of the first XOR gate XOR1. A first port (represented as 0 on MUX) of the multiplexer MUX is connected to the Q port of the fifth D-type flip flop D5. An output of the combination logic 80 comprises an output of the multiplexer MUX. For example, when cnt1_clr is logic high (1), and cnt2_clr is logic low (0), XOR1 outputs logic high (1), and the second port (represented as 1 on MUX) is selected, the multiplexer MUX outputs cnt2_clr, that is logic low (0). When cnt1_clr is logic low (0), and cnt2_clr is logic high (1), XOR1 outputs logic high (1), and the second port (represented as 1 on MUX) is selected, the multiplexer MUX outputs cnt2_clr, that is logic high (1). Note that FIG. 8 only shows how the multiplexer MUX is connected to the fifth D-type flip flop D5. Similar to FIG. 4, although not shown in FIG. 8, the clock port of the fifth D-type flip flop D5 is connected to the monitoring clock signal mck.

Figure 9:
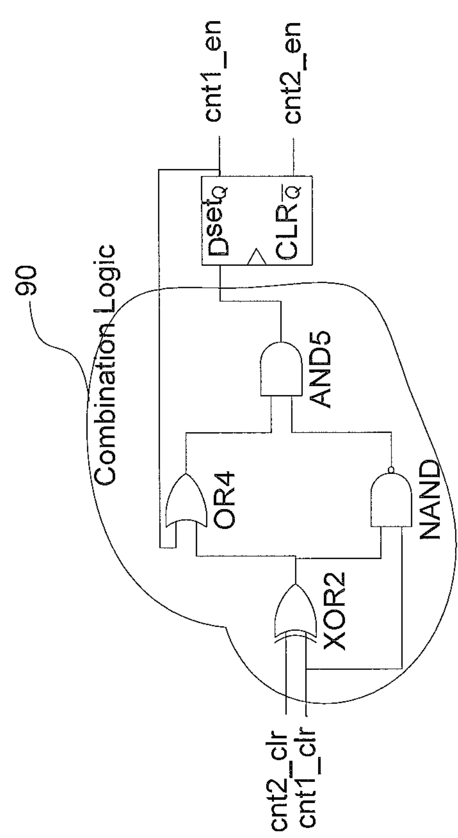
FIG. 9 is a circuit diagram illustrating another embodiment of the combination logic shown in FIG. 4 or 7.

FIG. 9 is a circuit diagram illustrating another embodiment of the combination logic shown in FIG. 4 or 7. The combination logic 90 further comprises a second XOR gate XOR2, a NAND gate, a fourth OR gate OR4, a fifth AND gate AND5. The second port (which is configured to receive signal cnt2_clr) of the combination logic 90 comprises a first port of the second XOR gate XOR2. The first port (which is configured to receive signal cnt2_clr) of the combination logic 90 comprises a second port of the second XOR gate XOR2. The second port of the XOR gate XOR2 is also connected to a first port of the NAND gate. The output port of the second XOR gate XOR2 is connected to both a first input port of the fourth OR gate OR4 and a second input port of the NAND gate. A second port of the fourth OR gate OR4 is connected to the Q port of the fifth D-type flip flop. Outputs of both the fourth OR gate OR4 and the NAND gate are connected to the fifth AND gate AND5. An output of the fifth AND gate AND5 is connected to the D port of the fifth D-type flip flop D5. An output of the combination logic 90 comprises the output of the fifth AND gate AND5. For example, when cnt2_clr is logic low (0), and cnt2_clr is logic high (1), XOR2 outputs logic high (1), and the NAND outputs logic high(1), and the fifth AND gate AND5 outputs logic high (1). When cnt1_clr is logic high (1), and cnt2_clr is logic low (0), XOR2 outputs logic high (1), and the NAND outputs logic low (0), and the fifth AND gate AND5 outputs logic low (0). Similar to FIG. 4, although not shown in FIG. 9, the clock port of the fifth D-type flip flop D5 is connected to the monitoring clock signal mck.

Figure 10:
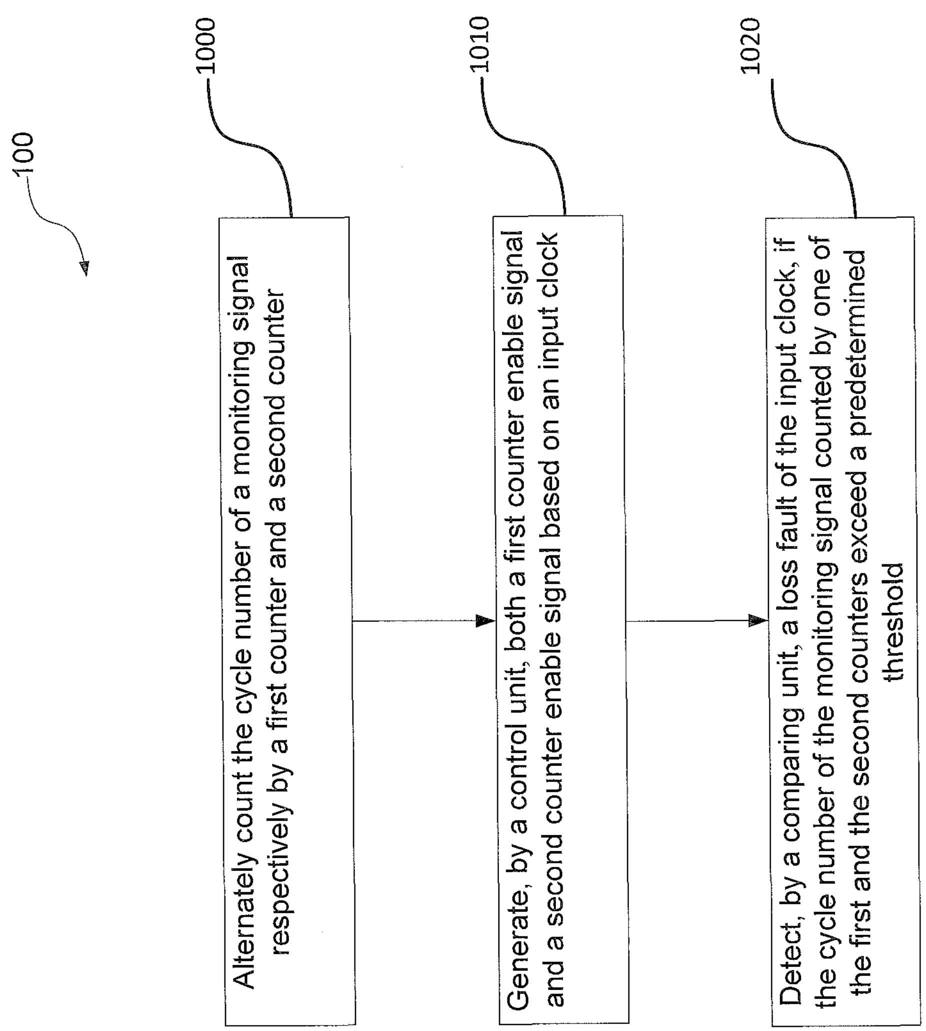
FIG. 10 is a flow chart of an embodiment method for detecting clock signal loss.

FIG. 10 is a flow chart of an embodiment method for detecting clock signal loss. The method 100 can operate, for example, in a device 10 shown in FIG. 1. The method 100 comprises alternately counting (in block 1000) a cycle number of a monitoring clock signal respectively by a first counter and a second counter; generating (in block 1010), by a control unit based on an input clock, both a first counter enable signal and a second counter enable signal that enable or disable the first and the second counters respectively, wherein the first counter enable signal and the second counter enable signal are inverted; and detecting (in block 1020), by a comparing unit, a loss fault of the input clock, if the cycle number of the monitoring clock signal counted by one of the first and the second counters exceed a predetermined threshold.

Figure 11:
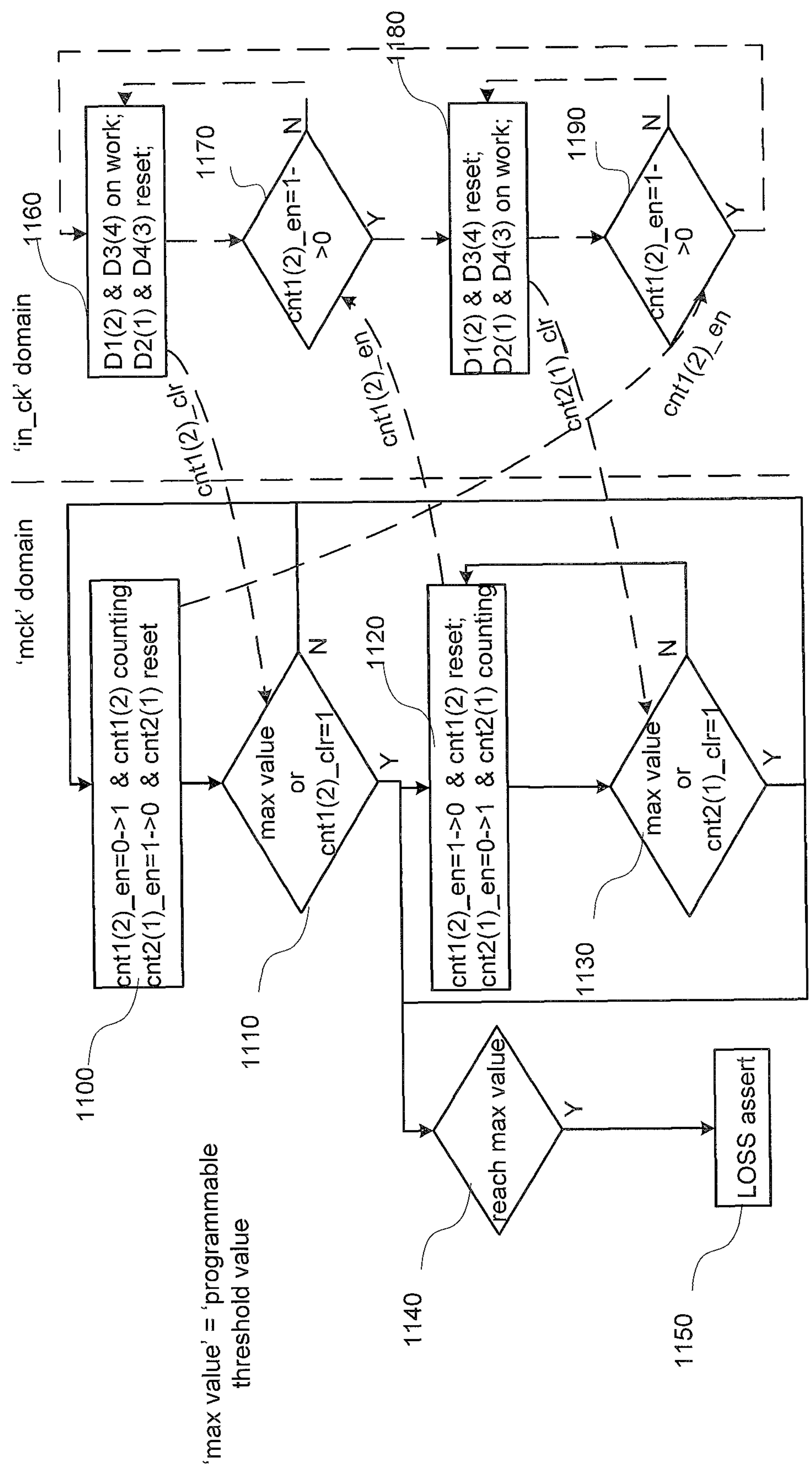
FIG. 11 is a flow chart of another embodiment method for detecting clock signal loss.

FIG. 11 is a flow chart of another embodiment method for detecting clock signal loss. Note that all the numbers in the parenthesis represents a second embodiment. Therefore, in the first embodiment, all the numbers in the parenthesis should be ignored, while in the second embodiment, only the numbers in the parenthesis should be considered and the number in front of the parenthesis should not be considered. For example cnt1(2)_en means the first counter enable signal cnt1_en or the second counter enable signal cnt2_en.

Referring to FIG. 11, the situation that the numbers in the parenthesis should be ignored is considered. First the monitoring clock signal mck domain is considered. In block 1100, initially, cnt1_en changes from logic 0 to logic 1 and cnt1 are counting, while cnt2_en changes from logic 1 to logic 0 & cnt2 reset. In other words, CNT1 works with cnt1_en changes from logic 0 to logic 1, and CNT2 does not work.

Then in block 1110, the method detects whether CNT1 reaches a max value or cnt1_clr=1.

To be specific, if CNT1 reaches a max value, the method goes to blocks 1140 and 1150, in block 1150 a signal loss is detected.

If cnt1_clr=1 (time b in FIG. 12), then the method proceed to block 1120. In block 1120, cnt1_en is from logic 1 to logic 0 & cnt1 reset (time c in FIG. 12); cnt2_en is from logic 0 to 1 & cnt2 starts counting. Then in block 1130, the method detects whether CNT1 reaches a max value or cnt1_clr=1.

If CNT1 does not reach a max value and cnt1_clr does not equal 1 in block 1110, the method goes back to block 1100.

If yes to CNT1 reaches a max value in the determining of block 1130, the method goes to blocks 1140 and 1150, and block 1100, in block 1150 a signal loss is detected, and in block 1100 the first counter CNT1 and second counter CNT2 continuously count alternatively.

Figure 12:
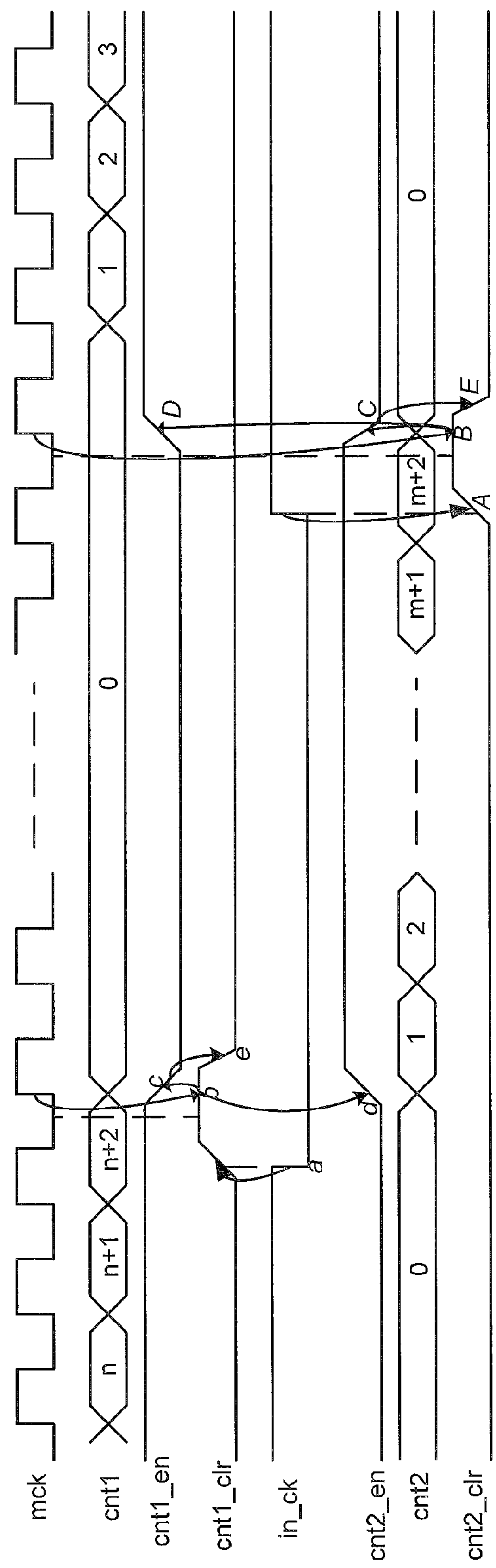
FIG. 12 is a timing diagram illustrating input clock, monitoring clock signal, two counter enable signals and two counter signals.

If yes to cnt2_clr=1 (time B in FIG. 12) in the determining of block 1130, then the method proceeds to block 1100, cnt1_en changes from logic 0 to logic 1 & cnt1 counting (time D in FIG. 12); cnt2_en changes from logic 1 to logic 0 & cnt2 reset (time C in FIG. 12).

If CNT1 does not reach a max value and cnt1_clr does not equal 1, the method goes back to block 1120.

Then the in_ck domain is considered, in block 1160, D1 & D3 are working, while D2 & D4 reset, therefore a cnt1_clr signal is generated and sent to block 1110 in mck domain.

Then block 1170 determines whether cnt1_en changes from logic 1 to logic 0.

If yes, the method proceeds to block 1180, wherein D1 & D3 are reset, and D2 & D4 work. Meanwhile a cnt2_clr signal is generated and fed to block 1130 in the mck domain. Then the method proceeds to block 1190, and the block 1190 determines whether cnt1_en changes from logic 1 to logic 0. If yes to block 1190, the method goes back to block 1160. If no to block 1190, the method goes back to block 1180.

If no to block 1170, the method proceeds back to block 1160.

Also note that the block 1120 also generates a cnt1_en signal and the signal is fed to block 1170. Block 1100 generates a cnt1_en signal and the signal is fed to block 1190. Note that the numbering of blocks across different domains does not indicate specific orders. For example block 1100 in mck domain and block 1160 in in_ck domain do not have to be performed in order recited. Block 1100 and block 1160 can be implemented in different order. Note that the above method also works for the signals illustrated in the parenthesis.

FIG. 12 is a timing diagram illustrating input clock in_ck, monitoring clock signal mck, two counter enable signals cnt1_en, ent2_en, and two counter signals cnt1 and cnt2. Note that two counter signals cnt1 and cnt2 are the respective output of the first counter CNT1 and the second counter CNT2. FIG. 12 also illustrates cnt1_clr, which is the first counter CNT1 reset signal, and cnt2_clr, which is the second counter CNT2 reset signal.

Referring to FIG. 12, during operation, the first counter CNT1 and the second counter CNT2 both are synchronous step counters. The two counters (CNT1 & CNT2), the two comparators (COMPARE1 & COMPARE2), and control unit (CTRL) work on monitor clock signal (mck) domain. mck domain is a complete synchronous circuit. The four D-Flip-Flops work with either rising edge or falling edge of input clock in_ck.

If cnt1_clr is active (for example time point a), after sampled by mck (for example, the rising edge of monitoring clock signal, such as time point b), the 'cnt1_en' is pulled low (for example time point c), and at the same time, the 'cnt2_en' is pulled high (for example time point d, note that time point c and time point d are substantially simultaneous). As cnt1_en is pulled down, the first counter CNT1 ceases count, and the second counter CNT2 starts count. The cnt1_en is also feed to the clear port CLR of first and third D-type flip flops D1 and D3 via the first inverter INV1, therefore D1 and D3 are reset and stop work (when D1 and D3 are reset, that means the Q output always equal to 0, and the Q output ignores the D port and clock inputs), while the second and fourth D-type flip flops D2 and D4 start work.

Similarly, if the 'cnt2_clr' is active (for example time point A), after sampled by mck (for example, the rising edge of monitoring clock signal, such as time point B), the 'cnt1_en' is pulled high (for example time point D). At the same time, the 'cnt2_en' is pulled low (for example time point C, note that time point C and time point D are substantially simultaneous). As cnt1_en is pulled high, the first counter CNT1 starts count, and the second counter CNT2 ceases count. If the high of the 'cnt1_clr' 'cnt2_clr' is detected by mck, current counter is reset and another counter starts counting immediately.

The cnt1_en is also feed to the clear port of first and third D-type flip flops D1 and D3 via the first inverter INV1, therefore D2 and D4 are reset and stop work, while the first and third D-type flip flops D1 and D3 start work. In other words, at the same time as the reset of one counter and start counting of the other counter, after some delay that guaranteed by causal control system, the previous working D-flip-flop pair goes into reset status and another pair starts to work. Here the causal control system means the assertion of one bit signal 'cnt1_en' is changed through the sampling on one bit signal 'cnt1_clr' on mck domain. The asynchronous reset action on 'cnt1_clr' (for example time point e) by 'cnt1_en' is only after the 'cnt1_en' is asserted by the effective sampling on 'cnt1_cir' (for example time point c). The same mechanism also works for 'cnt2_en' and 'cnt2_clr'.

During normal operation, 'cnt1_en' and 'cnt2_en' control two counters CNT1 and CNT2 to work in turns. For example, when the first counter CNT1 works, the second counter CNT2 ceases work. When the first counter CNT1 ceases work, the second counter CNT2 works.

During signal loss, the working counter continuously steps forward to its maximum value which equals the quantized programmable threshold if the corresponding enable signal keeps high. Loss indication signal (loss) can be detected as soon as the counter's value equals this programmable threshold value. Signal cnt1_clr from in_ck domain is sampled by mck to generate single bit counter enable signal cnt1_en. Signal in_ck is always run at two edge of in_ck. Signal cnt1_en is used as asynchronous reset signal, and the reset recovery timing of DFF is not cared. Similarly, signal cnt2_clr from in_ck domain is sampled by mck to generate single bit counter enable signal cnt2_en. Signal in_ck is always run at two edge of in_ck. Signal cnt2_en is used as asynchronous reset signal, and the reset recovery timing of DFF is not cared.

See FIG. 12 for another example. The first counter CNT1 is counting with D-type flip flops D1 and D3 on working status. At the same time, the second counter CNT2 is standby with the D-type flip flops D2 and D4 is in reset status. During the first counter CNT1 counting stage, one falling edge of 'in_ck' leads 'cnt1_clr' to high at time a. When mck detects the high of 'cnt1_clr' at time b, it will reset the first counter CNT1 (also signal cnt1) through pulling low its enable signal 'cnt1_en' at time c, and start the second counter CNT2 (also signal cnt2) through pulling high the 'cnt2_en' at time d. Because 'cnt1_en is only generated after the cnt1_clr' has been sampled correctly at time b, 'cnt1_en' can reset D-type flip flops D1 and D3 safely at time e. The high level of 'cnt1_clr' may be narrow but can always meet the hold timing requirement. The same treatment occurs, that during the second counter CNT2 counts 1,2, . . . until m+2, the second counter CNT2 is reset and the first counter CNT1 starts counting by rising edge of in_ck (time point A to E).

With the embodiments of the invention, clock loss fault can be checked out immediately so as to prevent the system using this clock to crash, without waiting for several periods to obtain an average value. In the embodiments, input clock loss fault can be detected as soon as the count exceeds the threshold.

In some embodiments, the monitor clock frequency does not need to be too high and only equals to a minimum threshold. Here minimum threshold indicates the lowest frequency of the mck to make sure this loss detection circuit can work. The minimum threshold may equal the frequency of CLK port of D1~D4 (in_ck) or the divided in_ck by the frequency divider. The threshold can be as long as possible or even as small as one monitoring clock period based on different monitoring clock frequency and input clock frequency.

In some embodiments, the fully digital synchronous circuit leads the threshold to be programmed easily.

In some embodiments, the duty cycle requirement on input clock for the synchronous circuit sampling is not needed because the circuit use input clock edge trigger directly, instead of voltage level trigger.

Further, as the two comparators work seamlessly, that is, if one stops counting, the other one resumes counting immediately, seamless checking can be obtained.

Causal control system leads communication between two clock domains (in_ck domain and mck domain) simply and safely, as the causal control system according to the embodiments does not need to exchange handshaking signal between different domains.

With the frequency divider shown in the embodiment of FIG. 4, the embodiments also works for the situation with the input clock frequency faster than or equal to the monitoring clock signal's.

Although the present invention has been described with reference to specific exemplary embodiments, the present invention is not limited to the embodiments described herein, and it can be implemented in form of modifications or alterations without deviating from the spirit and scope of the appended claims. Accordingly, the description and the drawings are to be regarded in an illustrative rather than a restrictive sense.

From the foregoing, it will be appreciated that specific embodiments of the technology have been described herein for purposes of illustration, however various modifications can be made without deviating from the spirit and scope of the present invention. Accordingly, the present invention is not restricted except in the spirit of the appended claims.

Other variations to the disclosed embodiments can be understood and effected by those skilled in the art in practicing the claimed invention, from a study of the drawings, the disclosure, and the appended claims. In the claims the word "comprising" does not exclude other elements or steps, and the indefinite article "a" or "an" does not exclude a plurality. Even if particular features are recited in different dependent claims, the present invention also relates to the embodiments including all these features. Any reference signs in the claims should not be construed as limiting the scope.

Features and aspects of various embodiments may be integrated into other embodiments, and embodiments illustrated in this document may be implemented without all of the features or aspects illustrated or described. One skilled in the art will appreciate that although specific examples and embodiments of the system and methods have been described for purposes of illustration, various modifications can be made without deviating from the spirit and scope of the present invention. Moreover, features of one embodiment may be incorporated into other embodiments, even where those features are not described together in a single embodiment within the present document. Accordingly, the invention is described by the appended claims.

We claim:

1. A device, comprising:

a first counter and a second counter, wherein the first counter and the second counter are configured to alternately count a cycle number of a monitoring clock signal;

a control unit configured to generate, based on an input clock, both a first counter enable signal and a second counter enable signal that enables or disables the first counter and the second counter respectively, wherein the first counter enable signal and the second counter enable signal are inverted; and a comparing unit coupled to both the first counter and the second counter and configured to detect a loss fault of the input clock if the cycle number of the monitoring clock signal counted by one of the first and the second counters exceeds a predetermined threshold.

2. The device of claim 1, further comprising a first D-type flip flop and a second D-type flip flop, wherein both clock ports of the first D-type flip flop and the second D-type flip flop are configured to receive the input clock, and an output port of the control unit is connected to a clear port of the second D-type flip flop, and the output port of the control unit is further connected to a clear port of the first D-type flip flop through a first inverter.

3. The device of claim 2, further comprising a third D-type flip flop and a fourth D-type flip flop, a first OR gate, a second OR gate and a second inverter, wherein both Q ports of the first D-type flip flop and the third D-type flip flop are connected to input ports of the first OR gate, an output port of the first OR gate is connected to the control unit;

both Q ports of the second D-type flip flop and the fourth D-type flip flop are connected to input ports of the second OR gate, an output port of the second OR gate is connected to the control unit;

both clock ports of the third D-type flip flop and the fourth D-type flip flop are configured to receive an inversion of the input clock via the second inverter, and the output port of the control unit is connected to clear ports of both the second D-type flip flop and the fourth D-type flip flop, and the output port of the control unit is further connected to a clear port of the third D-type flip flop through the first inverter; wherein all D ports of the first D-type flip-flop, the second D-type flip-flop, the third D-type flip-flop and the fourth D-type flip-flop are connected to a logic high.

4. The device of claim 3, wherein the control unit comprises a combination logic and a fifth D-type flip flop, a first port and a second port of the combination logic are respectively connected to both an output of the first OR gate and an output of the second OR gate, and the combination logic is configured to output, to the fifth D-type flip flop, a different value for detecting a logic high of the output of the first OR gate or the second OR gate respectively, and a Q port of the fifth D-type flip flop is configured to output the first counter enable signal, and a NOT Q port of the fifth D-type flip flop is configured to output the second counter enable signal.

5. The device of claim 4, wherein the combination logic further comprises a multiplexer and a first XOR gate, wherein the second port of the combination logic comprises a second port of the multiplexer, and the second port of the multiplexer is also connected to a first input port of the first XOR gate, the first port of the combination logic comprises a second input port of the first XOR gate, a select port of the multiplexer is connected to an output of the first XOR gate, wherein a first port of the multiplexer is connected to the Q port of the fifth D-type flip flop.

6. The device of claim 4, wherein the combination logic further comprises a second XOR gate, a NAND gate, a fourth OR gate, a fifth AND gate, wherein the second port of the combination logic comprises a first port of the second XOR gate, the first port of the combination logic comprises a second port of the second XOR gate, the second port of the second XOR gate is also connected to a first port of the NAND gate, the output port of the second XOR gate is connected to both a first port of the fourth OR gate and a second port of the NAND gate, a second port of the fourth OR gate is connected to the Q port of the fifth D-type flip flop, outputs of both the fourth OR gate and the NAND gate are connected to the fifth AND gate, and an output of the fifth AND gate is connected to the D port of the fifth D-type flip flop.

7. The device of claim 2, further comprising a third D-type flip flop and a fourth D-type flip flop, a first AND gate, a second AND gate and a second inverter, wherein both Q ports of the first D-type flip flop and the third D-type flip flop are connected to input ports of the first AND gate, an output port of the first AND gate is connected to the control unit;

both Q ports of the second D-type flip flop and the fourth D-type flip flop are connected to input ports of the second AND gate, an output port of the second AND gate is connected to the control unit;

both clock ports of the third D-type flip flop and the fourth D-type flip flop are configured to receive an inversion of the input clock, and the output port of the control unit is connected to a clear port of the fourth D-type flip flop, and the output port of the control unit is further connected to a clear port of the third D-type flip flop through the first inverter;

wherein all D ports of the first D-type flip-flop, second D-type flip-flop, third D-type flip-flop and fourth D-type flip-flop are connected to a logic low.

8. The device of claim 1, wherein the control unit is configured to output the first counter enable signal, and the control unit is also configured to output the second counter enable signal through a third inverter.

9. The device of claim 1, further comprising a frequency divider configured to divide the input clock by N before the input clock is configured to input to the control unit.

10. The device of claim 1, further comprising a first latch and a second latch, a third latch, a fourth latch, a third AND gate and a fourth AND gate, wherein both clock ports of the first latch and the second latch are configured to receive the input clock, and an output port of the control unit is connected to a clear port of the second latch, and the output port of the control unit is further connected to a clear port of the first latch through a first inverter;

both Q ports of the first latch and the third latch are connected to input ports of the third AND gate, an output port of the third AND gate is connected to the control unit;

both Q ports of the second latch and the fourth latch are connected to input ports of the fourth AND gate, an output port of the fourth AND gate is connected to the control unit;

both clock ports of the third latch and the fourth latch are configured to receive an inversion of the input clock, and the output port of the control unit is connected to a clear port of the fourth latch, and the output port of the control unit is further connected to a clear port of the third latch through the first inverter.

11. The device of claim 1, wherein the predetermined threshold is programmable.

12. The device of claim 1, wherein the comparing unit comprises a first comparator, a second comparator and a third OR gate, the first comparator is connected to the first counter and an output port of the first comparator is connected to a first input port of the third OR gate, the second comparator is connected to the second counter, and an output port of the second comparator is connected to a second input port of the third OR gate, and an output of the third OR gate is configured to indicate the loss fault of the input clock if the cycle number of the monitoring clock signal counted by one of the first counter and the second counter exceeds the predetermined threshold.

13. A method in a device, comprising:

alternately counting a cycle number of a monitoring clock signal respectively by a first counter and a second counter;

generating, by a control unit based on an input clock, both a first counter enable signal and a second counter enable signal that enables or disables the first counter and the second counter respectively, wherein the first counter enable signal and the second counter enable signal are inverted; and detecting, by a comparing unit, a loss fault of the input clock, if the cycle number of the monitoring clock signal counted by one of the first counter and the second counter exceeds a predetermined threshold.

14. The method of claim 13, wherein the device further comprises a first D-type flip flop and a second D-type flip flop, wherein both clock ports of the first D-type flip flop and the second D-type flip flop are configured to receive the input clock, and an output port of the control unit is connected to a clear port of the second D-type flip flop, and the output port of the control unit is further connected to a clear port of the first D-type flip flop through a first inverter.

15. The method of claim 14, wherein the device further comprises a third D-type flip flop and a fourth D-type flip flop, a first OR gate, a second OR gate and a second inverter, wherein both Q ports of the first D-type flip flop and the third D-type flip flop are connected to input ports of the first OR gate, an output port of the first OR gate is connected to the control unit;

both Q ports of the second D-type flip flop and the fourth D-type flip flop are connected to input ports of the second OR gate, an output port of the second OR gate is connected to the control unit;

both clock ports of the third D-type flip flop and the fourth D-type flip flop are configured to receive an inversion of the input clock via the second inverter, and the output port of the control unit is connected to clear ports of both the second D-type flip flop and the fourth D-type flip flop, and the output port of the control unit is further connected to a clear port of the third D-type flip flop through the first inverter; wherein all D ports of the first, second, third and fourth D-type flip-flops are connected to a logic high.

16. The method of claim 15, wherein the control unit comprises a combination logic and a fifth D-type flip flop, a first port and a second port of the combination logic are connected to an output of the first OR gate and an output of the second OR gate respectively, and the combination logic is configured to output, to the fifth D-type flip flop, a different value for detecting a logic high of the output of the first OR gate or the second OR gate respectively, and a Q port of the fifth D-type flip flop is configured to output the first counter enable signal, and a NOT Q port of the fifth D-type flip flop is configured to output the second counter enable signal.

17. The method of claim 16, wherein the combination logic further comprises a multiplexer and a first XOR gate, wherein the second port of the combination logic comprises a second port of the multiplexer, and the second port of the multiplexer is also connected to a first input port of the first XOR gate, the first port of the combination logic comprises a second input port of the first XOR gate, a select port of the multiplexer is connected to an output of the first XOR gate, wherein a first port of the multiplexer is connected to the Q port of the fifth D-type flip flop.

18. The method of claim 16, wherein the combination logic further comprises a second XOR gate, a NAND gate, a fourth OR gate, a fifth AND gate, wherein the second port of the combination logic comprises a first port of the second XOR gate, the first port of the combination logic comprises a second port of the second XOR gate, the second port of the second XOR gate is also connected to a first port of the NAND gate, the output port of the second XOR gate is connected to both a first port of the fourth OR gate and a second port of the NAND gate, a second port of the fourth OR gate is connected to the Q port of the fifth D-type flip flop, outputs of both the fourth OR gate and the NAND gate are connected to the fifth AND gate, and the output of the fifth AND gate is connected to the Q port of the fifth D-type flip flop.

19. The method of claim 14, wherein the device further comprises a third D-type flip flop and a fourth D-type flip flop, a first AND gate, a second AND gate and a second inverter, wherein both Q ports of the first D-type flip flop and the third D-type flip flop are connected to input ports of the first AND gate, an output port of the first AND gate is connected to the control unit;

both Q ports of the second D-type flip flop and the fourth D-type flip flop are connected to input ports of the second AND gate, an output port of the second AND gate is connected to the control unit;

both clock ports of the third D-type flip flop and the fourth D-type flip flop are configured to receive an inversion of the input clock, and the output port of the control unit is connected to a clear port of the fourth D-type flip flop, and the output port of the control unit is further connected to a clear port of the third D-type flip flop through the first inverter; wherein all D ports of the first, second, third and fourth D-type flip-flops are connected to a logic low.

20. The method of claim 13, wherein the control unit is configured to output the first counter enable signal, and the control unit is also configured to output the second counter enable signal through a third inverter.

21. The method of claim 13, further comprising dividing, by a frequency divider, the input clock by N before the input clock is configured to input to the control unit.

22. The method of claim 13, wherein the device further comprises a first latch, a second latch, a third latch, a fourth latch, a third AND gate and a fourth AND gate, wherein both clock ports of the first latch and the second latch are configured to receive the input clock, and an output port of the control unit is connected to a clear port of the second latch, and the output port of the control unit is further connected to a clear port of the first latch through a first inverter;

both Q ports of the first latch and the third latch are connected to input ports of the third AND gate, an output port of the third AND gate is connected to the control unit;

both Q ports of the second latch and the fourth latch are connected to input ports of the fourth AND gate, an output port of the fourth AND gate is connected to the control unit;

both clock ports of the third latch and the fourth latch are configured to receive an inversion of the input clock, and the output port of the control unit is connected to a clear port of the fourth latch, and the output port of the control unit is further connected to a clear port of the third latch through the first inverter.

23. The method of claim 13, wherein the predetermined threshold is programmable.

24. The method of claim 13, wherein the comparing unit comprises a first comparator, a second comparator and a third OR gate, the first comparator is connected to the first counter and an output port of the first comparator is connected to a first input port of the third OR gate, the second comparator is connected to the second counter, and an output port of the second comparator is connected to a second input port of the third OR gate, and an output of the third OR gate is configured to indicate the loss fault of the input clock if the cycle number of the monitoring clock signal counted by one of the first and the second counters exceeds a predetermined threshold.

* * * * *